(12) United States Patent
Bugge et al.

(10) Patent No.: US 11,158,487 B2
(45) Date of Patent: Oct. 26, 2021

(54) DIAGONAL COMPOUND MILL

(71) Applicant: FEI Company, Hillsboro, OR (US)

(72) Inventors: Clifford Russell Bugge, Portland, OR (US); Craig Henry, Hillsboro, OR (US); Michael B. Schmidt, Gresham, OR (US); Mark Najarian, Beaverton, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/370,023

(22) Filed: Mar. 29, 2019

(65) Prior Publication Data

US 2020/0312618 A1    Oct. 1, 2020

(51) Int. Cl.
*H01J 37/305*    (2006.01)
*H01J 37/20*    (2006.01)
*H01J 37/147*    (2006.01)
*H01J 37/28*    (2006.01)
*H01L 21/67*    (2006.01)

(52) U.S. Cl.
CPC ...... *H01J 37/3056* (2013.01); *H01J 37/1478* (2013.01); *H01J 37/20* (2013.01); *H01J 37/28* (2013.01); *H01L 21/67288* (2013.01); *H01J 2237/31745* (2013.01)

(58) Field of Classification Search
CPC ........ H01J 37/1478; H01J 37/20; H01J 37/28; H01J 37/3056; H01J 2237/31745; H01L 21/67288
See application file for complete search history.

(56) References Cited

U.S. PATENT DOCUMENTS

| 9,941,096 | B2 | 4/2018 | Schmidt et al. | |
|---|---|---|---|---|
| 2006/0284112 | A1* | 12/2006 | Tomimatsu | H01J 37/3056 250/492.1 |
| 2013/0186747 | A1* | 7/2013 | Schmidt | H01J 37/3005 204/192.33 |
| 2013/0328246 | A1* | 12/2013 | Wells | H01J 37/3023 264/400 |
| 2015/0357159 | A1* | 12/2015 | Stone | H01J 37/3056 204/192.33 |
| 2016/0148783 | A1* | 5/2016 | Lopour | G01N 1/32 250/307 |
| 2017/0278673 | A1* | 9/2017 | Tomimatsu | H01J 37/20 |

OTHER PUBLICATIONS

Reuteler, "FIB artifacts and how to overcome them," EuFN FIB Workshop, 25 pages (Jul. 5, 2016).

* cited by examiner

*Primary Examiner* — David E Smith
(74) *Attorney, Agent, or Firm* — Klarquist Sparkman, LLP (57) ABSTRACT

Ion beams are directed to a substrate surface to expose a tapered, tilted surface in the substrate. The ion beams and the substrate are situated so that a first ion beam is incident along a first axis at a glancing angle, and a second ion beam is incident along a second axis in a plane defined by the glancing angle and at an angle with respect to the first axis. Exposure to the second ion beam tends to produced superior quality in the exposed surface such as by reducing curtain artifacts.

18 Claims, 7 Drawing Sheets

DIAGONAL COMPOUND MILL

FIELD

The disclosure pertains to charged particle beam milling.

BACKGROUND

Inspection, repair, and evaluation of semiconductor devices can be performed using charged particle beams. Electron microscopy permits high resolution imagery of complex circuits. Ion beams can be used to mill or otherwise process substrates. For example, ion beams have been directed to substrates at glancing angles to mill planar surfaces that are slightly tilted with respect to substrate surfaces as described in Schmidt and Bugge, U.S. Pat. No. 9,941,096, which is incorporated herein by reference. These tilted planar surfaces can reveal three dimensional details of structures defined in the substrates such as 3D NAND memory. After milling, the tilted surface can be imaged using, for example, electron microscopy, to permit device assessments.

While glancing-angle milling provides a surface that shows structural details as a function of depth in a substrate, the surfaces typically include artifacts that interfere with device characterization. In some cases, the artifacts complicate user assessment of electron microscope images of the tilted surface. In applications in which rapid assessments are needed, image artifacts can slow evaluations or render computer-aided evaluation ineffective. For these and other reasons, improved approaches are needed.

SUMMARY

Methods include situating a selected portion of a surface of a sample at a glancing angle with respect to an ion beam axis in a first orientation. An ion beam is directed toward the selected portion of the surface at the glancing angle along the ion beam axis in the first orientation to mill at least the selected portion of the surface to expose a milled surface at the glancing angle. The selected portion of the surface of the sample is situated at a second orientation different from the first orientation with respect to the ion beam axis. With the sample in the second orientation with respect to the ion beam axis, the ion beam is directed to the exposed milled surface at the glancing angle. In some examples, at least one of the first orientation and the second orientation of the ion beam axis is established by displacing the ion beam axis or at least one of the first orientation and the second orientation of the ion beam axis is established based on positioning of the sample. In typical examples, the sample is secured to a tilt stage, and the first orientation and the second orientation are established by the tilt stage.

In additional examples, the first orientation and the second orientation of the sample are associated with a first cross-milling angle and a second cross-milling angle, respectively, having an angular difference of at least 1 degree, at least 5 degrees, or at least 10 degrees. According to some embodiments, the angular difference between the first orientation and the second orientation is at least 10 degrees and the glancing angle is between 1 and 10 degrees.

Systems include an ion beam column situated to direct an ion beam along an ion beam axis. A system controller is coupled to at least one of the ion beam column and a sample stage to establish a first orientation and a second orientation of a sample situated on a sample stage with respect to the ion beam axis. The first orientation and the second orientation are different and at least the first orientation is at a glancing angle with respect to a sample surface. The system controller is further coupled to direct the ion beam to the sample in the first orientation and the second orientation. In some examples, in the first orientation, the controller is coupled to the ion beam column to mill a substrate at the glancing angle and establish a planar exposed surface of the sample at the glancing angle. In a typical example, in the second orientation, the controller is coupled to the ion beam column to expose the planar exposed surface of the sample with the ion beam in a plane parallel to the planar exposed surface. In some embodiments, the first orientation and the second orientation are associated with an angular difference of at least 1 degree, 5 degrees, or 10 degrees.

According to further examples, systems include a sample stage, wherein the system controller is coupled to the sample stage to establish the first orientation and the second orientation. In other examples, an ion beam deflector is situated to deflect the ion beam axis and the system controller is coupled to the ion beam deflector to establish at least one of the first orientation and the second orientation with the ion beam deflector. In other representative examples, an electron beam column is situated to produce an image of the planar exposed surface produced by ion beam milling and the system controller is coupled to the electron beam column to initiate acquisition of the image. In further embodiments, the system controller is configured to process the image to identify a defect in the sample. In some typical examples, the system controller is coupled to the substrate stage to arrange the planar exposed surface with respect to the electron beam column to produce the image.

Methods include preparing an exposed surface of a sample by cross-axis, glancing angle ion beam milling and obtaining an image of the exposed surface with an electron beam. The surface is then evaluated based on the obtained image.

The foregoing and other features and advantages of the technology will become more apparent from the following detailed description, which proceeds with reference to the accompanying figures.

DETAILED DESCRIPTION

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items unless the context clearly dictates otherwise.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. Examples may be described with reference to directions indicated as "above," "below," "upper," "lower," and the like. These terms are used for convenient description, but do not imply any particular spatial orientation.

As used herein, glancing-angle ion beam exposure or milling refers to directing an ion beam toward a surface of a substrate at a glancing angle with respect to the surface. A glancing angle is an angle of less than 30, 20, 15, 10, 7.5, 5, 2.5, or 1 degree with respect to a surface of a substrate, generally a major surface of the substrate. Ion beam milling or processing in which an ion beam is directed to a substrate at a glancing along a single axis is referred to a single-axis, glancing-angle milling, exposure, or processing. As disclosed herein, substrates are exposed to ion beams along two (or more) different axes to expose a plane in the substrate at the glancing angle; such exposures are referred to herein as dual-axis, multiple-axis, or cross-axis milling, exposure, or processing. Typically two axes are used for convenience, and an angle between the axes is greater than 1, 2, 4, 5, 6, 7.5, 10, 12, or 15 degrees. In most examples, these axes are at glancing angles with respect to a substrate surface, so that exposures, milling, and processing are referred to glancing-angle, single-axis or glancing angle cross-axis exposure, milling, and processing. Glancing-angle milling is referred to as establishing an exposed surface at a glancing angle which typically corresponds to a glancing angle along which an ion beam is incident, but these glancing angles can be slightly different. In glancing-angle, cross-axis exposures as described herein, ion beams are incident to a sample in a glancing angle plane.

In some examples, samples evaluated or processed with the disclosed methods and apparatus are so-called 3D NANDs. Diagonal cross sections of 3D NAND substrates can show several layers that consist of stacked canister or cylinder structures of various density materials. In some processes, stacks of up to 96 layers are used. Conventional diagonal cross sections typically exhibit curtain artifacts, creating metrology issues for many 3D NAND devices. The disclosed approaches reduce or eliminate curtain artifacts, allowing for better device measurement and evaluation. Using an ion beam such as a focused ion beam (FIB), large cross sections can be milled, such as 40-100 μm cut faces with ~130 canisters within a row. Larger cuts of 100 μm are possible allowing for larger numbers of data points for device metrology. However, the disclosed approaches can be used with other samples and substrates as well.

Example 1

Figure 1A:
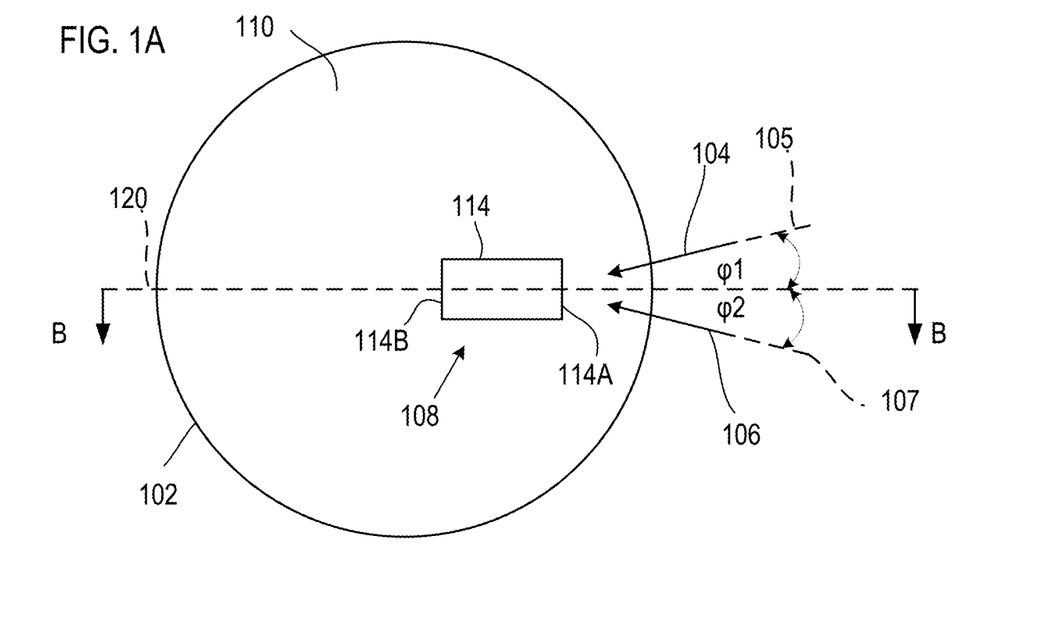
FIG. 1A is a plan view of a representative sample situated to be milled by an ion beam at two cross angles.
Figure 1B:
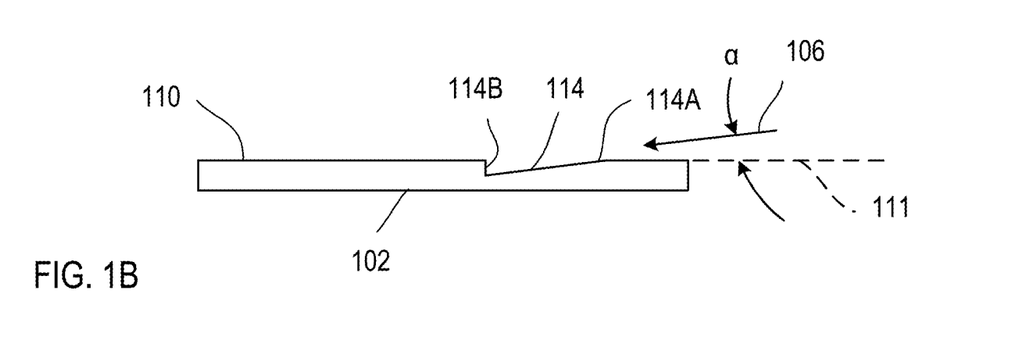
FIG. 1B is a sectional view of the sample of FIG. 1A illustrating an exposed surface formed by milling the sample by directing an ion beam at two cross angles in glancing plane.

Referring to FIGS. 1A-1B, a sample 102 such as semiconductor substrate is situated to receive ion beams 104, 106 along respective axes 105, 107 that are at cross angles $\varphi 1$, $\varphi 2$ with respect to an axis 120 of a surface area 108 to be exposed by ion beam processing. In typical examples, the ion beams 104, 106 are produced with the same ion beam source and one or more of the sample 102, the ion beam source, or an ion beam axis are moved to produce the different cross angles. For example, as shown in FIG. 1A, the axes 105, 107 can be produced by deflecting an ion beam or re-orientation of the ion beam source with respect to the sample. Many practical ion beam systems include a sample stage (often a so-called 5-axis stage) that permits the sample to be selectively oriented so that the ion beam is incident at the first cross angle for some exposures and the second cross angle at other exposures. As shown in FIG. 1B, the ion beam is also incident to the sample 102 at a glancing angle α with respect to plane 111 of the major surface 110. As a result of exposure to and milling by the ion beam, an exposed surface 114 is defined that is at the glancing angle with respect to the major surface 110. As shown, the exposed surface 114 tapers from a location 114A closest to ion beam incidence to a location 114B distal from ion beam incidence.

The cross angles $\varphi 1$, $\varphi 2$ need not be symmetric about the axis 120, but any two cross axes can be used having a suitable angular difference. In some cases, a first ion beam exposure is produced by directing the ion beam along a glancing axis in a plane containing the axis 120 and a second exposure is produced by directing the ion beam along a glancing axis that is at an angle with respect to the axis of the first ion beam exposure. While two axes and the associated exposures are generally sufficient, multiple axes and associated exposures can be used. In some examples, a first exposure is used for most of the milling operations, and a second exposure at a cross angle is used to remove or attenuate artifacts such as curtain artifacts.

Example 2

Figure 6A:
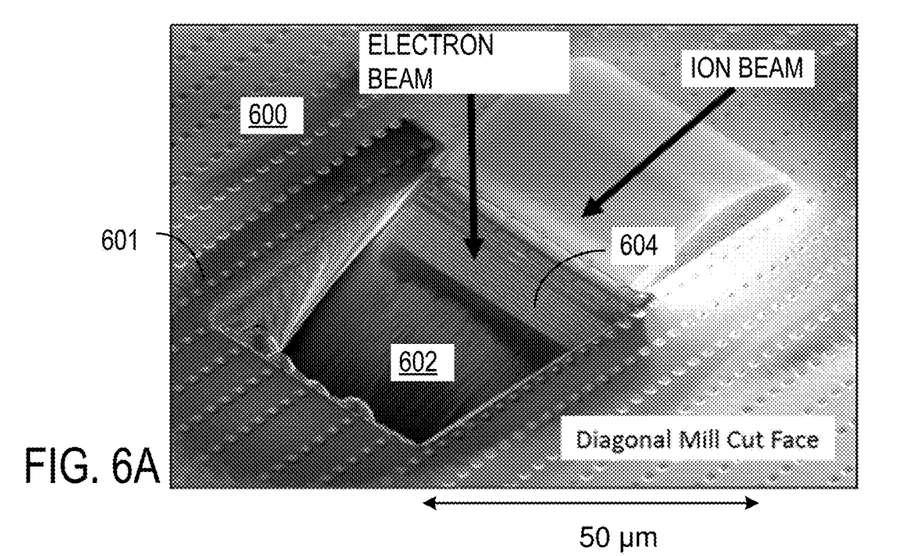
FIG. 6A is an electron micrograph showing a tapered exposed area produced by single-axis ion beam milling at a glancing angle.
Figure 6B:
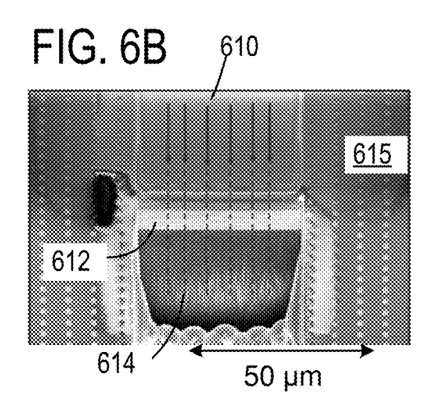
FIG. 6B is an electron micrograph showing an enlarged view of a tapered exposed area produced by single-axis ion beam milling at a glancing angle such as shown in FIG. 6A.

Samples processed as shown in FIGS. 1A-1B along with glancing-angle, single-axis processing are illustrated in FIGS. 6A-6E. FIG. 6A is an electron micrograph of a substrate 600 having a major surface 601 into which a tapered exposed surface 602 is produced by exposure to an ion beam at a single cross angle. Typically, an exposed area 604 proximate the major surface 601 is the region of interest as various circuit structures are defined in the substrate 600 near the major surface 601. A direction of incidence of an ion beam used for ion beam milling and a direction of incidence of an electron beam used for electron microscopy are also indicated. FIG. 6B is an electron micrograph showing an exposed surface 614 of a substrate 615 that includes a surface portion 612 corresponding to circuit elements defined in the substrate 615. The exposed surface 614 is produced with glancing-angle, single-axis ion beam exposure along a glancing direction 610 and shows striations parallel to the direction 610. These striations are sometimes referred to as resulting from a "curtain" or "waterfall" effect and appear in the surface portion 612 (although not apparent in FIG. 6B) and complicate analysis of the surface portion 612.

Figure 6C:
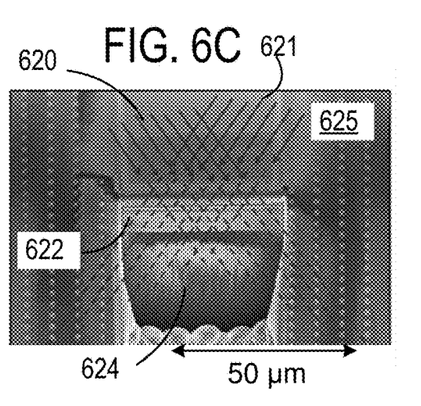
FIG. 6C is an electron micrograph showing an enlarged view of a tapered exposed area produced by cross-axis ion beam milling at a glancing angle such as shown in FIG. 6A.
Figure 6D:
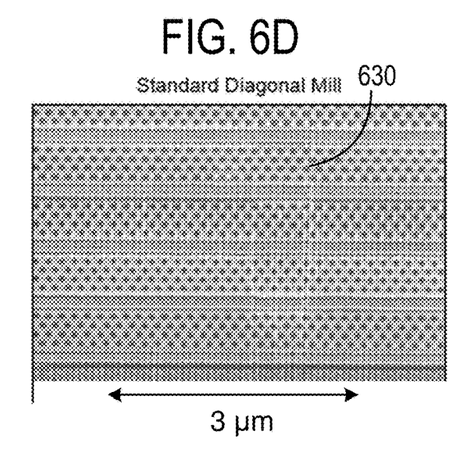
FIGS. 6D-6E are electron micrographs showing an enlarged view of circuit portions of tapered exposed areas produced by glancing-angle single-axis and cross-axis ion beam milling, respectively.
Figure 6E:
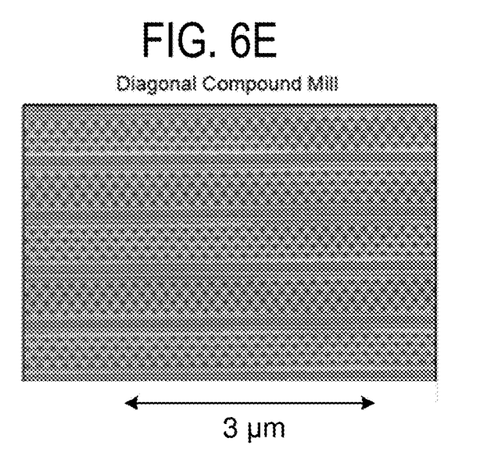

FIG. 6C shows an exposed surface 624 of a substrate 625 that includes a surface portion 622 corresponding to circuit elements defined in the substrate 625. The exposed surface 614 is produced with an ion beam incident along glancing directions 620, 621; striations associated with the curtain or waterfall effect are substantially reduced. FIGS. 6D-6E show portions of tapered surfaces produced by single-axis, glancing angle ion beam milling such as shown in FIG. 6B and cross-axis, glancing angle ion beam milling such as shown in FIG. 6C, respectively. Striations such as striation 630 are apparent in FIG. 6D but none are seen in FIG. 6E, showing that cross-axis milling provides superior exposed surface quality.

Example 3

Figure 2:
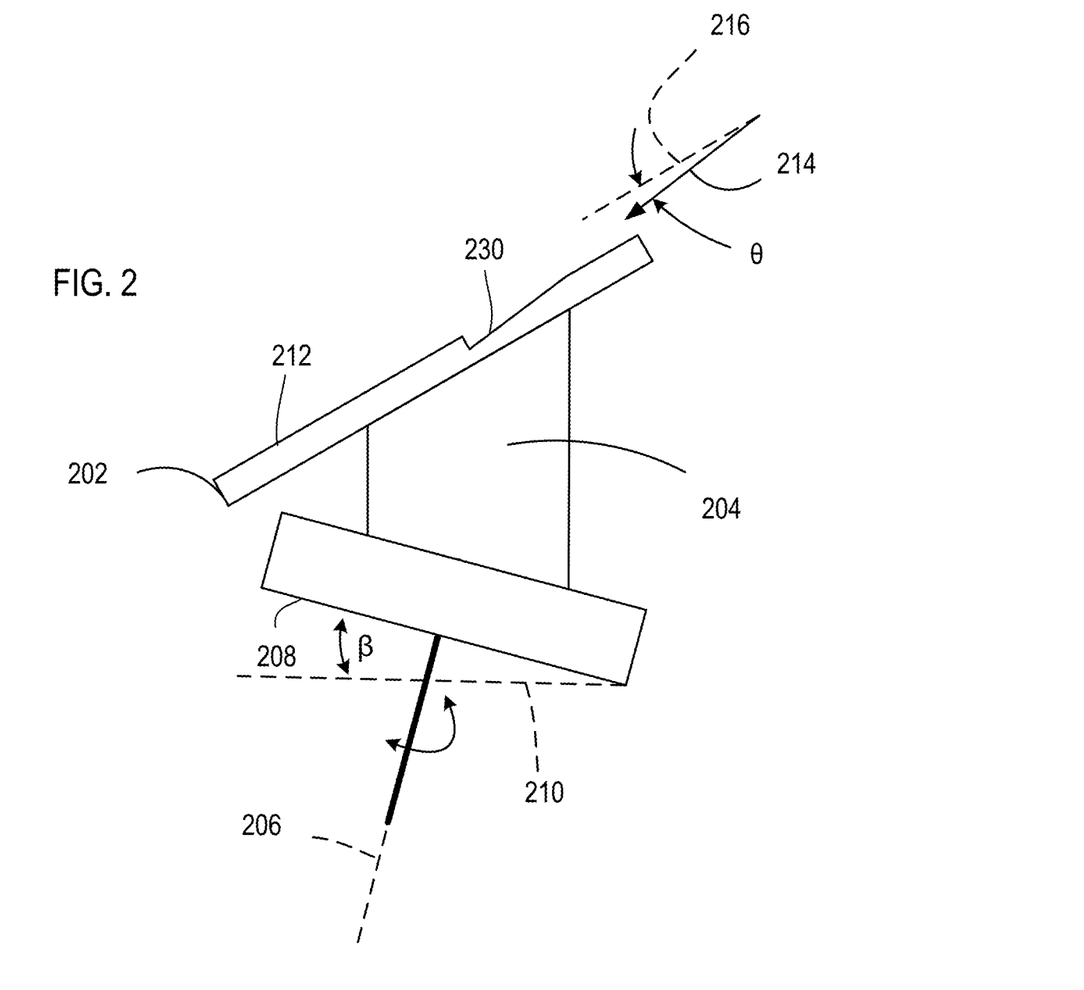
FIG. 2 illustrates a representative sample situated for glancing-angle, cross-axis milling.

Referring to FIG. 2, as sample 202 is secured to a stub 204 that is rotatable about an axis 206 with a substrate stage 208 that is tilted at an angle β with respect to a reference plane 210. A major surface 212 of the sample 202 is situated to receive an ion beam 214 along one or more axes that are at a glancing angle θ with respect to a plane 216 that is parallel to the major surface 212, or in a glancing angle plane. Exposures to the ion beam produce a tapered surface 230. The stub 204 and the substrate stage 208 provide tilts that are selected to provide glancing angle incidence of the ion beam as well as selecting cross axes for cross-axis exposures. In most practical examples, the substrate stage 208 permits multi-axis, multi-angle positioning, and control of the substrate stage 208 permits control of cross angles and glancing angle as well.

Example 4

Figure 3:
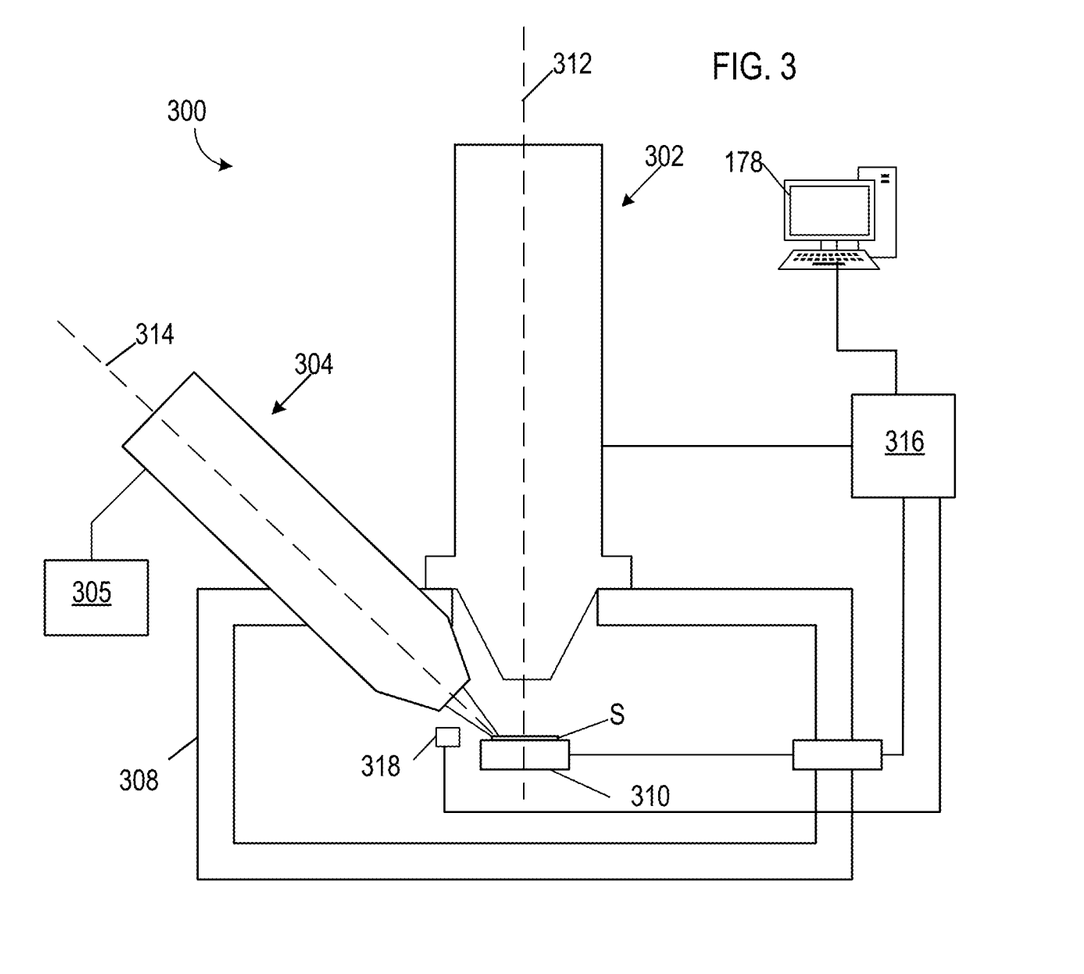
FIG. 3 illustrates a representative dual beam (electron/ion beam) system for use in glancing-angle cross-axis ion beam milling and electron beam imaging of the surface exposed by the milling.

Referring to FIG. 3, in a representative embodiment, an ion beam/electron beam system 300 comprises a scanning electron microscope (SEM) 302, and an ion beam column 304 coupled to a gas manifold 305. The ion beam column 304 is arranged to provide a focused ion beam (FIB) to a sample S along an axis 314, and the SEM 302 is situated for production of an image of the sample S. The SEM 302 and the ion beam column 304 can be mounted to a vacuum chamber 308 housing a movable substrate holder 310 for holding sample S. The vacuum chamber 308 can be evacuated using vacuum pumps (not shown). The SEM 302 can produce a beam of input charged particles (e.g., an electron beam) that propagates along a particle-optical axis 312. The ion beam column 304 can produce and direct an ion beam along an ion-optical axis 314 to perform imaging, processing and/or machining operations on the substrate, such as incising, etching, milling, depositing, etc.

The dual-beam system 300 can further comprise a computer processing apparatus and/or a control unit 316 for controlling the positioning and alignment of the sample S. The control unit 316 can also control the SEM 302 and the ion beam column 304. The control unit 316 can provide various excitations, record data, and generally control operation of the SEM and the FIB, including positioning and orientation of the substrate holder 310.

The control unit 316 is coupled to the sample holder 310 to establish first and second cross axes for ion beam exposures of the sample S at glancing angles. While tilting or moving the sample S permits selection of glancing angle and cross-axes, the ion beam axis can be controlled as well. For example, as shown schematically in FIG. 3, a beam deflector 318 is situated to interact with the ion beam to select suitable angles.

Example 5

Figure 4:
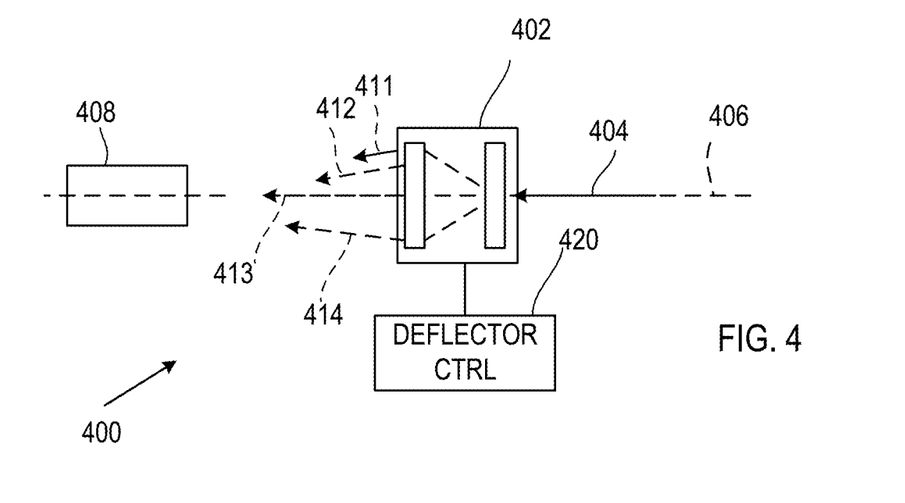
FIG. 4 illustrates a representative ion beam deflector situated for glancing angle cross-axis exposure of a sample surface.

Referring to FIG. 4, a system 400 for glancing-angle, cross-axis processing of a sample includes a beam deflector 402 situated to receive an ion beam 404 propagating along an axis 406 and selectively direct the ion beam to a sample region 408 along one or more axes such as representative axes 411, 412, 413, 414 associated with respective cross angles; each of these axes can be associated with a common glancing angle. One of the selected angles can correspond an undeflected ion beam axis, if convenient. Selection of particular cross-axes is controlled by a deflection controller 420 that energizes one or more electric or magnetic deflectors or deflection elements such as coils or electrostatic deflectors. In some examples, angles are set exclusively by the deflection controller, but in other cases combinations of electrical and/or magnetic deflection and mechanical positioning are used.

Example 6

Figure 5:
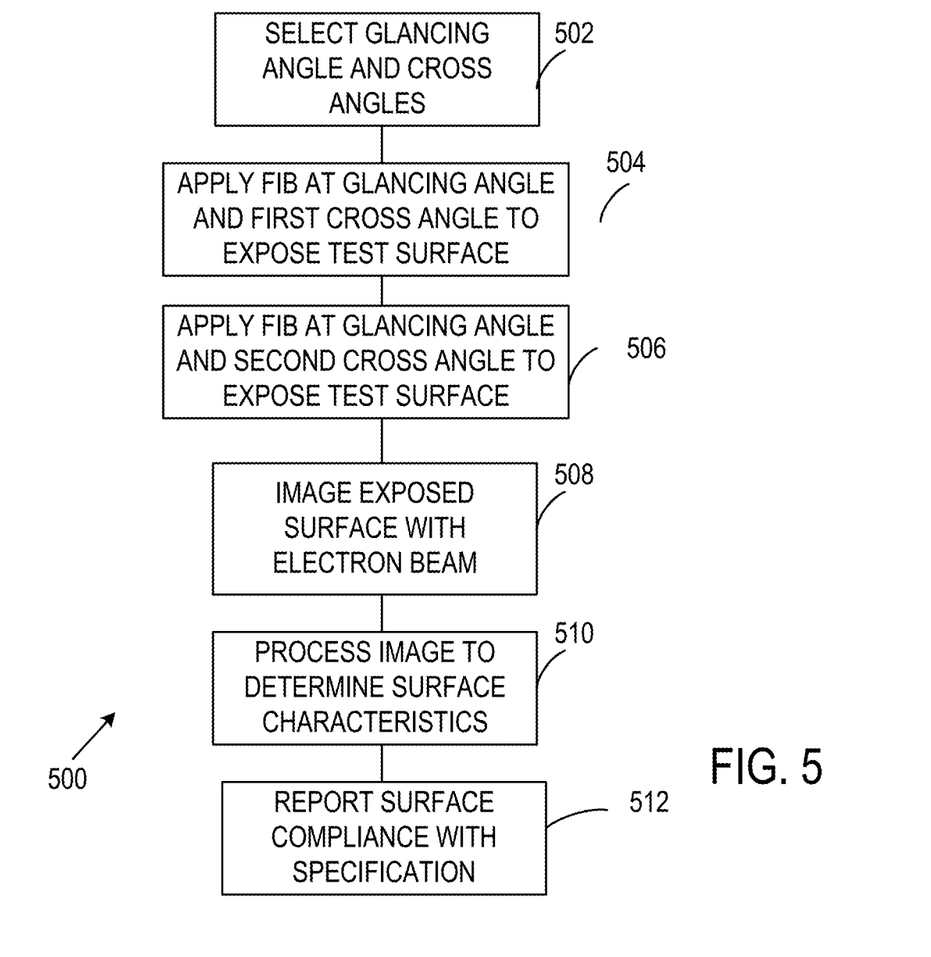
FIG. 5 illustrates a representative ion beam milling method.

Referring to FIG. 5, a representative method 500 of processing a substrate includes selecting a glancing angle and cross-axis angles at 502. At 504, a focused ion beam (FIB) is directed to the substrate at a first cross-axis angle to expose a test surface by milling a substrate surface at the glancing angle. At 506, the FIB is directed to the substrate at the second cross-axis angle to complete the formation of the test surface with additional milling. In some cases, milling at the second cross angle is used to remove surface defects on the exposed test surface. At 508, at least a portion of the test surface is imaged, typically using an electron beam, and the image is stored for additional processing. While the image can be presented for viewing by a user, at 510 the image is processed using computer-based evaluation and measurement procedures to provide a sample assessment. For example, machine learning methods can be applied such a processing with a neural network derived using a test set of acceptable or specification-compliant surface characteristics. At 512, a report is generated identifying sample characteristics, particularly any deviations from substrate specifications.

Example 7

Figure 7:
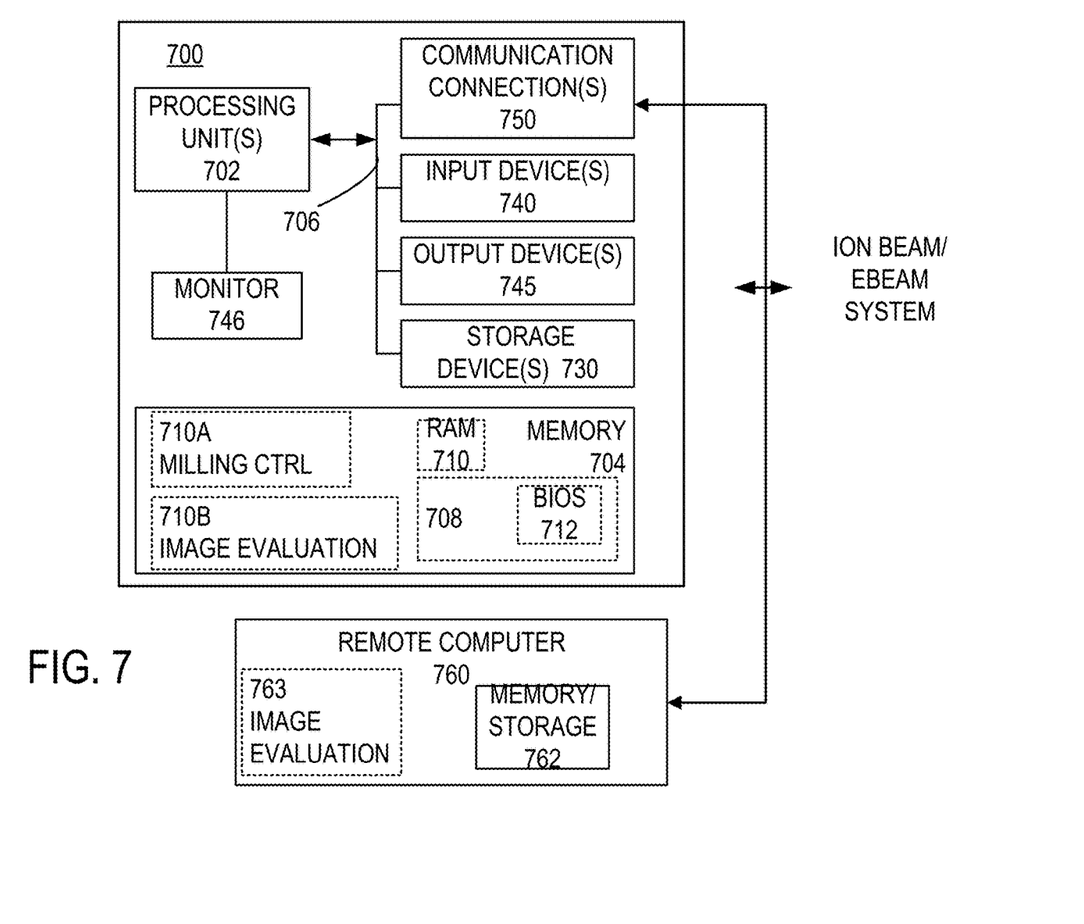
FIG. 7 illustrates a representative computer environment for use with the disclosed approaches.

In some examples, one or more of ion beam milling, sample placment, electron microscopic imaging, and milled surface evaluation are controlled with computer-executable instructions stored in one or more computer readable storage devices either at or near an ion beam/electron beam system or coupled via a wide area network. FIG. 7 and the following discussion are intended to provide a brief, general description of an exemplary computing environment for controlling these operations. In other examples, individual processor-based controls can be provided for sample stages, electron columns, ion beam columns or image and sample evaluation. The disclosed technology may be implemented with other computer system configurations, including hand held devices, multiprocessor systems, microprocessor-based or programmable consumer electronics, network PCs, minicomputers, mainframe computers, and the like. The disclosed technology may also be practiced in distributed computing environments where tasks are performed by remote processing devices that are linked through a communications network.

With reference to FIG. 7, an exemplary system for implementing the disclosed technology includes a general purpose computing device in the form of an exemplary conventional PC 700, including one or more processing units 702, a system memory 704, and a system bus 706 that couples various system components including the system memory 704 to the one or more processing units 702. The system bus 706 may be any of several types of bus structures including a memory bus or memory controller, a peripheral bus, and a local bus using any of a variety of bus architectures. The exemplary system memory 704 includes read only memory (ROM) 708 and random access memory (RAM) 710. A basic input/output system (BIOS) 712, containing the basic routines that help with the transfer of information between elements within the PC 700, is stored in ROM 708. In the example of FIG. 7, data and processor-executable instructions for controlling FIB milling such as establishing beam orientations, beam currents, specimen position and orientation, glancing angles and multi-axis milling angles are stored in a memory 710A and data and processor-executable instruction for image acquisition, image analysis and evaluation are stored in a memory 710B.

The exemplary PC 700 further includes one or more storage devices 730 such as a hard disk drive for reading from and writing to a hard disk, a magnetic disk drive for reading from or writing to a removable magnetic disk, and an optical disk drive. Such storage devices can be connected to the system bus 706 by a hard disk drive interface, a magnetic disk drive interface, and an optical drive interface, respectively. The drives and their associated computer readable media provide nonvolatile storage of computer-readable instructions, data structures, program modules, and other data for the PC 700. Other types of computer-readable media which can store data that is accessible by a PC, such as magnetic cassettes, flash memory cards, digital video disks.

A number of program modules may be stored in the storage devices 730 including an operating system, one or more application programs, other program modules, and program data. A user may enter commands and information into the PC 700 through one or more input devices 740 such as a keyboard and a pointing device such as a mouse. A monitor 746 or other type of display device is also connected to the system bus 706 via an interface, such as a video adapter.

The PC 700 may operate in a networked environment using logical connections to one or more remote computers, such as a remote computer 760. In some examples, one or more network or communication connections 750 are included. The remote computer 760 may be another PC, a server, a router, a network PC, or a peer device or other common network node, and typically includes many or all of the elements described above relative to the PC 700, although only a memory storage device 762 has been illustrated in FIG. 7. The personal computer 700 and/or the remote computer 760 can be connected to a logical a local area network (LAN) and a wide area network (WAN). As shown in FIG. 7, the remote computer 760 includes the memory storage device 762 as well as a memory 763 for data and processor-executable instructions for image analysis. An ion beam/electron beam system can be remotely controlled, if desired.

Additional Examples

Cross-axis milling can also be implemented with ion beams directed along two, three, or more axes. While typically a single ion beam is used and alternately or sequentially directed along such axes, an axis of irradiation can also be continuously swept or stepped along a plurality of axes. Two or more ion beams produced by respective ion beam sources can be used, and each ion beam can have a different composition, and need not use the same ion. While generally an initial ion beam exposure is used to produce an exposed planar region in the substrate and a second ion beam exposure is used to improve surface quality, alternating or other exposures can be used in which each of two or more exposures contributes substantially to substrate milling and surface quality improvement.

In view of the many possible embodiments to which the principles of the disclosed technology may be applied, it should be recognized that the illustrated embodiments are only preferred examples and should not be taken as limiting the scope of the disclosure. We therefore claim all that comes within the scope and spirit of the appended claims.

We claim:
1. A method, comprising:
  situating a sample support stub on a rotatable, tilted sample stage;
  situating a selected portion of a surface of a sample secured to the stub at a glancing angle of less than 10 degrees with respect to an ion beam axis in a first orientation;
  directing an ion beam toward the selected portion of the surface at the glancing angle along the ion beam axis in the first orientation to mill at least the selected portion of the surface to expose a milled surface at the glancing angle;
  rotating the sample stage about an axis that is tilted with respect to the selected portion of the surface of the sample to situate the selected portion of the surface of the sample at a second orientation with respect to the ion beam axis, wherein the second orientation is different from the first orientation; and with the sample in the second orientation with respect to the ion beam axis, directing the ion beam to the exposed milled surface at the glancing angle, wherein the first orientation and the second orientation of the sample are associated with a first cross-milling angle and a second cross-milling angle, respectively, having an angular difference of at least 1 degree.

2. The method of claim 1, wherein at least one of the first orientation and the second orientation of the ion beam axis is established by displacing the ion beam axis.

3. The method of claim 1, wherein at least one of the first orientation and the second orientation of the ion beam axis is established based on positioning of the sample.

4. The method of claim 1, wherein the angular difference between the first orientation and the second orientation is at least 5 degrees.

5. The method of claim 1, wherein the angular difference between the first orientation and the second orientation is at least 10 degrees.

6. The method of claim 1, wherein the glancing angle is between 1 and 10 degrees.

7. A system, comprising:

an ion beam column situated to direct an ion beam along an ion beam axis; and a system controller coupled to at least one of the ion beam column and a sample stage to:

establish a first orientation and a second orientation of a sample situated on the sample stage with respect to the ion beam axis, wherein the first orientation and the second orientation are different and the first orientation and the second orientation are at a glancing angle with respect to a sample surface, wherein the sample is situated on a stub that is secured to the sample stage, the stub retaining the sample at a tilt angle so that a major surface of the sample is tilted with respect to the sample stage and the second orientation is produced by rotation about an axis that is tilted with respect to the major surface of the sample; and direct the ion beam to the sample in the first orientation and the second orientation, wherein the first orientation and the second orientation of the sample are associated with a first cross-milling angle and a second cross-milling angle, respectively, having an angular difference of at least 1 degree.

8. The system of claim 7, wherein in the first orientation, the controller is coupled to the ion beam column to mill a substrate at the glancing angle and establish a planar exposed surface of the sample at the glancing angle.

9. The system of claim 7, wherein the axis that is tilted with respect to the major surface is perpendicular to a mounting surface of the substrate stage.

10. The system of claim 7, where the first orientation and the second orientation are associated with an angular difference of at least 5 degrees.

11. The system of claim 7, further comprising a sample stage, wherein the system controller is coupled to the sample stage to establish the first orientation and the second orientation.

12. The system of claim 7, further comprising an ion beam deflector situated to deflect the ion beam axis and the system controller is coupled to the ion beam deflector to establish at least one of the first orientation and the second orientation with the ion beam deflector.

13. The system of claim 8, further comprising an electron beam column situated to produce an image of the planar exposed surface produced by ion beam milling.

14. The system of claim 13, wherein the system controller is coupled to the electron beam column to initiate acquisition of the image.

15. The system of claim 14, wherein the system controller is configured to process the image to identify a defect in the sample.

16. The system of claim 15, wherein the system controller is coupled to the substrate stage to arrange the planar exposed surface with respect to the electron beam column to produce the image.

17. A method, comprising:

preparing an exposed surface of a sample by cross-axis, glancing-angle ion beam milling the sample in a glancing angle plane with a first cross-milling angle and a second cross-milling angle, wherein the exposed surface is at a glancing angle with respect to a major surface of the sample and the second cross-milling angle is established by rotation about an axis that is tilted with respect to a major surface of the substrate;

obtaining an image of the exposed surface with an electron beam; and evaluating the surface based on the obtained image.

18. The method of claim 17, wherein the first cross-milling angle and the second cross-milling angle differ by between one degree and 10 degrees.

* * * * *